Feb. 6, 1968 R. CULLIS 3,367,806
METHOD OF ETCHING A GRADED METALLIC FILM
Filed Nov. 24, 1964
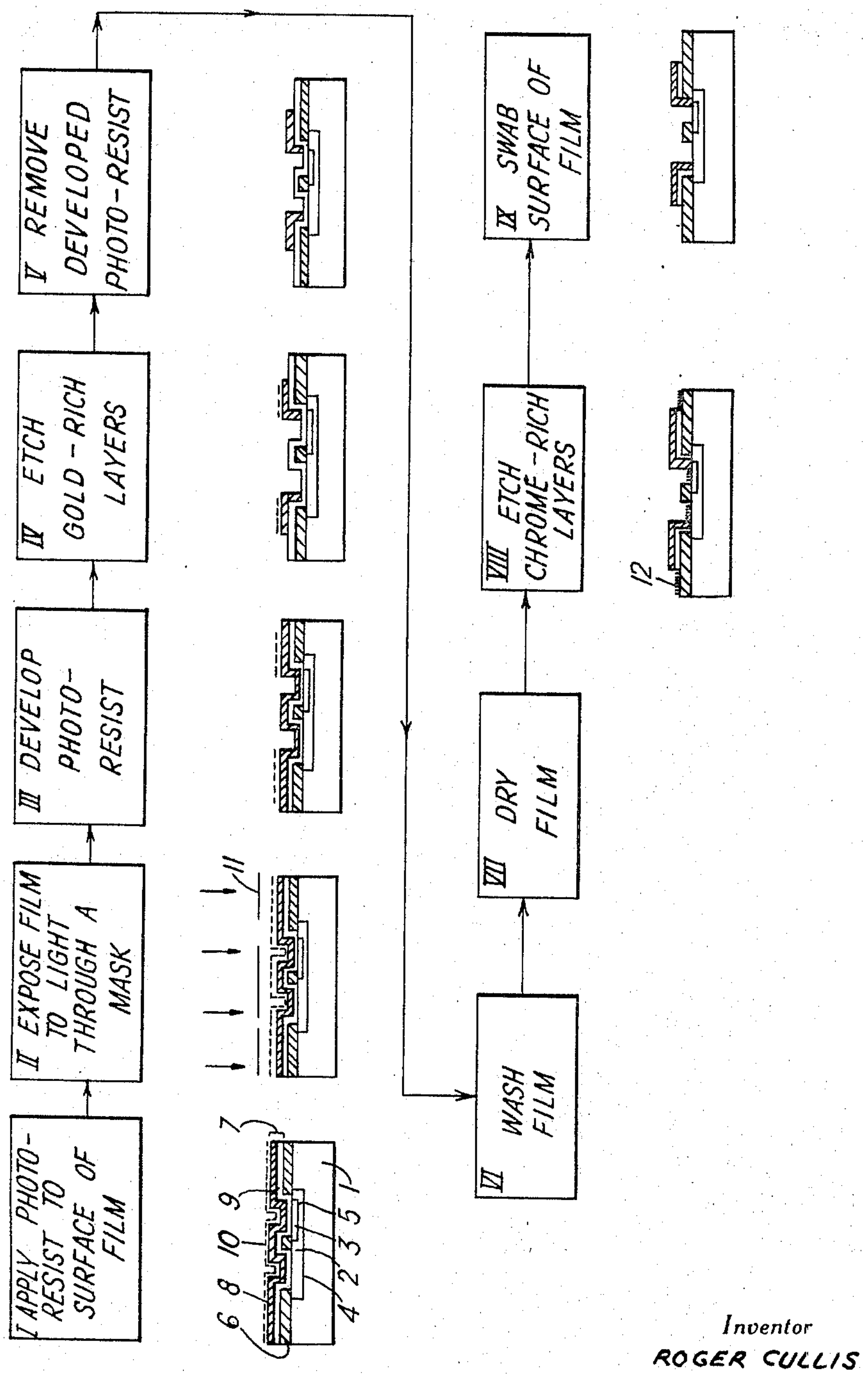
Inventor
ROGER CULLIS
By [signature]
Attorney

United States Patent Office 3,367,806
Patented Feb. 6, 1968

3,367,806
METHOD OF ETCHING A GRADED METALLIC FILM

Roger Cullis, London, England, assignor to International Standard Electric Corporation, New York, N.Y., a corporation of Delaware Filed Nov. 24, 1964, Ser. No. 413,463
Claims priority, application Great Britain, Jan. 7, 1964, 705/64
5 Claims. (Cl. 156—17)

This invention relates to metallic films comprising graded layers of two metals deposited on an insulating substrate, and to methods of etching such films. In general, the two metals making up the film are sufficiently dissimilar to require different treatments to achieve successful etching.

There is known the deposition on an insulating substrate of a metallic film comprising graded layers of two metals, one of the metals being adhesive to the substrate and the other being a soft solderable metal, the layers being graded in content successively so that the relative proportion of adhesive metal with respect to the soft solderable metal decreases through the film with increase in distance from the substrate. In particular, a graded film of chromium and gold is produced on a glass plate by a process of vacuum deposition.

U.S. Patent 3,270,256, assigned to the assignee of this invention, describes the application of graded metallic films deposited according to the said earlier specification, firstly as large area contacts on planar silicon semiconductor devices, and further as conductors between a number of such devices formed in a single silicon substrate. A graded metallic film formed initially over the whole surface of an insulating substrate can be restricted to the required contact areas by selectively etching away the unwanted film.

According to the present invention there is provided a method of selectively etching a metallic film deposited on an insulating substrate, which metallic film comprises graded layers of chromium, being adhesive to the substrate, and a soft solderable metal, the layers being graded in content so that the relative proportion of chromium with respect to the soft solderable metal decreases through the layers with increase in distance from the substrate, in which method the layers rich in said soft solderable metal in a selected area or areas are first etched away in a first process step, and in which the chromium-rich layers beneath said first etched layers are subsequently etched away in a second etching step using a dilute solution of hydrochloric acid, the second etching step being preceded by, or accompanied by, a process step to remove oxides of chromium formed during the first etching step, so as to enable said second step to be initiated.

The invention mill now be described, using by way of example, its application to the forming of large area contacts on a planar silicon semiconductor device, and with reference to the accompanying drawing illustrating a flow diagram for the etching process, together with sections through the semiconductor device at various stages of the process.

The semiconductor device comprises a silicon wafer 1, cut from a single crystal of silicon having a specified type of conductivity, or grown epitaxially on a single crystal and having sucht conductivity, in which zones 2, 3 of different conductivity type have been formed by diffusion from a plane surface which zones are separated from one another and from the bulk silicon by rectifying junctions 4, 5 extending to the surface of the wafer. These junctions are protected by a layer 6 of silicon oxide, grown during the diffusing process, or subsequently, in which windows have been etched, giving access to the zones beneath (i.e. within or between the junctions). Contacts to these zones are made in a later process stage by means of a chrome-gold graded film 7 formed in known manner over the whole surface of the wafer.

In stages I and II of the process, the areas of the film required as contacts are masked off by applying a photo-resist (10) to the whole surface of the film and exposing the photo-resist to light through a mask (11) having opaque areas corresponding to the unwanted areas of film; the unexposed photo-resist is subsequently removed (stage IV) by a developing process, thus leaving windows in the photo-resist layer which expose the metal film beneath.

The gold-rich layers (8) of the graded film are etched in stage IV, using a moderated aqua regia solution prepared by mixing three parts by volume hydrochloric acid, one part nitric acid and three parts acetic acid, and allow ing the solution to stand until it is a golden yellow colour. The water is placed in the aqua regia solution, and the gold-rich layers dissolve away from the unexposed areas of the film. The completion of this stage is made apparent by the silvery appearance of the unexposed areas which is characteristic of chrome-rich layers.

The developed photo-resist is removed in stage V using a solvent, and the film is thoroughly washed in deionized water (stage VI) and then dried (stage VII).

As implied above, aqua regia has no particular etching effect on the chromium-rich layers, and for this purpose, dilute hydrochloric acid is in the next stage (VIII) for removing the remainder of the graded layer in the exposed areas.

However, the aqua regia is liable to have a deleterious effect, so far as this subsequent stage is concerned, in rendering the chromium surface *passive* by formation of chromium oxide, which inhibits the start of the etching process by the hydrochloric acid. To meet this contingency, the hydrochloric acid is used in the presence of a powerful reducing agent, for example, hydrazine dihydrochloride removes the oxide and allows the etching process to commence. Additionally, or alternatively, nascent hydrogen may be used as a reducing agent, or the surface of the chromium may be made the cathode of an electrolytic cell.

However, only the process using hydrazine dihydrochloride will be described herein.

The dilute hydrochloric acid solution is prepared by heating a two percent by volume solution of hydrochloric acid in acetic acid to boiling point, then adding approximately three grams per 100 ml. of hydrazine dihydrochloride to the solution to saturate it.

Masking of the film is not required for this stage, since the remaining parts of the gold-rich layers themselves act as a mask to protect the required parts of the chrome-rich layers from the hydrochloric acid solution. The hot hydrochloric acid solution is poured over the silicon wafer, which is then heated, and the chromium is etched away slowly and uniformly. A black film (12) formed on the surface of the wafer during this process can be swabbed away (stage IX).

Silver can be used instead of gold in the graded film, and the silver-rich layers can be etched using a dilute nitric acid solution. It is also possible to dissolve away the gold-rich layers or the silver-rich layers with a cyanide solution.

An advantage of forming large area contacts in this way is that the contacts are very accurately positioned. It is possible to deposit a graded metallic film only on those parts of the wafer where large area contacts are required, by covering the wafer with an apertured mask during the deposition process but it is very difficult to arrange the wafer in the apparatus without moving the mask.

What I claim is:

1. Method of selectively etching a metallic film deposited on a substrate, which metallic film comprises graded layers of chromium, being adhesive to the substrate, and a soft solderable metal, the layers being graded in content so that the relative proportion of chromium with respect to the soft solderable metal decreases through the layers with increase in distance from the substrate, comprising the steps of etching away the layers rich in said soft solderable metal in a selected area or areas removing oxides of chromium formed during the etching away of said soft, solderable metal and etching away the chromium-rich layers beneath said first etched layers using a dilute solution of hydrochloric acid in acetic acid.

2. Method of etching a metallic film according to claim 1, and in which the chromium-rich layers are etched using a hot dilute solution of hydrochloric acid in acetic acid while the substrate is heated.

3. Method of etching a metallic film according to claim 1, in which the chrome-rich layers are etched using a dilute hydrochloric acid solution prepared by heating a two percent by volume solution of hydrochloric acid in acetic acid to boiling point, and then adding approximately three grams of hydrazine dihydrochloride per 100 ml. of the solution.

4. Method of etching a metallic film according to claim 1, and in which said soft solderable metal is gold.

5. Method of etching a metallic film according to claim 1, and in which said soft solderable metal is silver.

References Cited

UNITED STATES PATENTS 3,256,588 6/1966 Sikina et al. -------- 29—155.5

FOREIGN PATENTS 953,556 4/1964 Great Britain.
1,023,532 3/1966 Great Britain.

JACOB H. STEINBERG, *Primary Examiner.*